(12) United States Patent  
Funaki

(10) Patent No.: US 11,122,216 B2  
(45) Date of Patent: Sep. 14, 2021

(54) SOLID-STATE IMAGING DEVICE

(71) Applicant: SAMSUNG ELECTRONICS CO., LTD., Suwon (KR)

(72) Inventor: Masaki Funaki, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/660,592

(22) Filed: Jul. 26, 2017

(65) Prior Publication Data

US 2018/0091723 A1 Mar. 29, 2018

(30) Foreign Application Priority Data

Sep. 23, 2016 (JP) .............................. JP2016-185672

(51) Int. Cl.
*H04N 5/235* (2006.01)
*H04N 5/363* (2011.01)
(Continued)

(52) U.S. Cl.
CPC ....... *H04N 5/2357* (2013.01); *H01L 27/1463* (2013.01); *H01L 27/1469* (2013.01); *H01L 27/14605* (2013.01); *H01L 27/14607* (2013.01); *H01L 27/14632* (2013.01); *H01L 27/14634* (2013.01); *H01L 27/14687* (2013.01); *H04N 5/355* (2013.01); *H04N 5/35563* (2013.01); *H04N 5/35581* (2013.01); *H04N 5/363* (2013.01); *H04N 5/3696* (2013.01); *H04N 5/374* (2013.01); *H04N 5/378* (2013.01); *H04N 5/379* (2018.08); *H04N 5/37452* (2013.01); *H01L 23/38* (2013.01); *H01L 25/167* (2013.01);
(Continued)

(58) Field of Classification Search
CPC ............ H01L 25/167; H01L 27/14643; H01L 27/14605; H01L 31/107; H01L 27/14658; H01L 31/02027
See application file for complete search history.

(56) References Cited

U.S. PATENT DOCUMENTS

| 2002/0011552 A1* | 1/2002 | Sugiyama | ............. H04N 3/155 250/208.1 |
| 2011/0001861 A1* | 1/2011 | Tanaka | ............... H04N 5/37457 348/300 |

(Continued)

FOREIGN PATENT DOCUMENTS

JP       2015-88917 A       5/2015

*Primary Examiner* — Marcos D. Pizarro
*Assistant Examiner* — Quinton A Brasfield
(74) *Attorney, Agent, or Firm* — Sughrue Mion, PLLC

(57) ABSTRACT

A first pixel circuit has a plurality of photodiodes of different sizes. A second pixel circuit is connected to the first pixel circuit, and has a holding portion that holds a first optical signal and a second optical signal. The peripheral circuit drives and controls the second pixel circuit, and determines whether a voltage value of the first optical signal is equal to or greater than a predetermined value. When it is determined that the voltage value of the first optical signal is equal to or greater than the predetermined value, a signal obtained by adding the second optical signal to the first optical signal is set as an output signal. When it is determined that the voltage value of the first optical signal is less than the predetermined value, the first optical signal is set as an output signal.

8 Claims, 11 Drawing Sheets

(51) Int. Cl.
*H04N 5/355* (2011.01)
*H04N 5/369* (2011.01)
*H04N 5/3745* (2011.01)
*H01L 27/146* (2006.01)
*H04N 5/374* (2011.01)
*H04N 5/378* (2011.01)
H01L 23/38 (2006.01)
H01L 25/16 (2006.01)
H01L 31/024 (2014.01)

(52) U.S. Cl.
CPC .... *H01L 27/1464* (2013.01); *H01L 27/14621* (2013.01); *H01L 27/14627* (2013.01); *H01L 27/14636* (2013.01); *H01L 27/14645* (2013.01); *H01L 31/024* (2013.01)

(56) References Cited

U.S. PATENT DOCUMENTS

| | | | |
|---|---|---|---|
| 2014/0043510 A1* | 2/2014 | Kasuga | H04N 5/363 348/300 |
| 2016/0088249 A1* | 3/2016 | Funaki | H01L 27/14634 348/296 |
| 2017/0338269 A1* | 11/2017 | Kimura | H01L 27/14643 |

* cited by examiner

SOLID-STATE IMAGING DEVICE

CROSS REFERENCE TO RELATED APPLICATION

This application is based upon and claims the benefit of priority under 35 U.S.C. § 119 from Japanese Patent Application No. 2016-185672, filed on Sep. 23, 2016, the entire contents of which are incorporated herein by reference.

BACKGROUND

The present disclosure relates to a solid-state imaging device, and particularly to an on-vehicle backside illumination solid-state imaging device.

When the solid-state imaging device is used by being mounted on a vehicle, a phenomenon called LED flicker is problematic. Usually, in an LED display device such as a traffic light, the LED light quantity is adjusted by PWM (Pulse Width Modulation). LED flicker is a phenomenon when an image captured during a period at which the LED is turned off is darkened, and is seen as flickering. In Japanese Unexamined Patent Application Publication No. 2015-88917 (Patent Document 1), an imaging device for processing an image by detecting flicker is disclosed.

SUMMARY

In the imaging device as disclosed in Patent Document 1, however, it takes time to process the image, and thus the imaging device is not suitable to be mounted on a vehicle intended to display the captured image in real time.

An aspect of the embodiment provides a solid-state imaging device including: a first pixel circuit including a plurality of photodiodes of different sizes; a second pixel circuit that is connected to the first pixel circuit; and a peripheral circuit configured to drive and control the second pixel circuit.

The second pixel circuit includes a holding portion configured to hold a first optical signal and a second optical signal, the first optical signal and the second optical signal being respectively obtained by the plurality of photodiodes of different sizes at a first exposure time and a second exposure time shorter than the first exposure time.

The peripheral circuit determines whether a voltage value of the first optical signal is equal to or greater than a predetermined value, wherein when it is determined that the voltage value of the first optical signal is equal to or greater than the predetermined value, a signal obtained by adding the second optical signal to the first optical signal is set as an output signal; and when it is determined that the voltage value of the first optical signal is less than the predetermined value, the first optical signal is set as an output signal.

DETAILED DESCRIPTION

Figure 1:
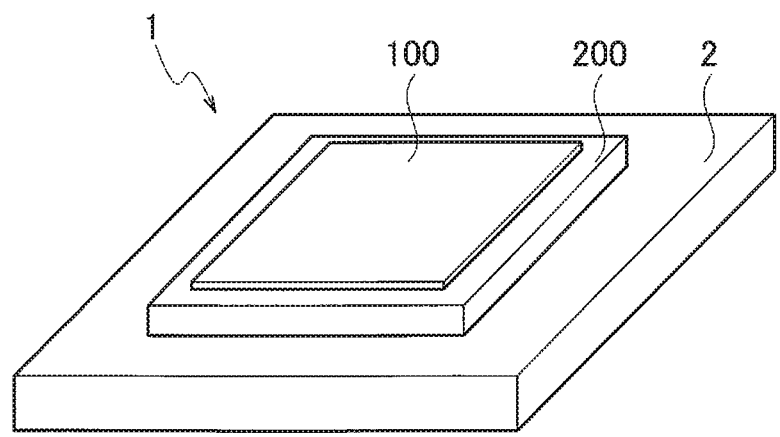
FIG. 1 is a perspective view illustrating a solid-state imaging device according to at least one embodiment.

A configuration example of a solid-state imaging device according to the embodiment will be described with reference to FIG. 1. A solid-state imaging device 1 includes a substrate 100 (first substrate), a substrate 200 (second substrate), and a heat sinking plane 2. The substrate 100 photoelectrically converts light incident from the outside and generates an optical signal. The substrate 200 is connected to the substrate 100, and holds and outputs the optical signal. The heat sinking plane 2 dissipates heat generated by the substrate 100 and the substrate 200 to the outside. For example, the heat sinking plane 2 is formed with a temperature controller such as a Peltier element, and may control temperatures of the substrate 100 and the substrate 200.

The substrate 100 is a silicon substrate having a thickness of about 10 μm, for example. The substrate 200 is a silicon substrate having a thickness of about 200 μm to 1 mm, for example. The thickness of the heat sinking plane 2 is about 1 mm to 3 mm. As a material of the heat sinking plane 2, a metal, ceramic having high thermal conductivity, plastic, a carbon-based material such as diamond, sapphire, various semiconductor substrates, or a multilayer circuit board may be used. Further, a part of the package may function as the heat sinking plane 2.

The substrate 200 may be made larger than the substrate 100. A pad for connection with an external circuit may be formed outside a region of the substrate 200 to which the substrate 100 is connected. The substrate 100 and the substrate 200 may have the same size.

The heat sinking plane 2 may be made larger than the substrate 200. By an increase in the size of the heat sinking plane 2, the heat sinking capability can be improved. A tunnel portion penetrating the substrate 200 may be formed, micro bumps may be formed in the tunnel portion, and the substrate 100 and the substrate 200 may be connected to the external circuit through the heat sinking plane 2.

Figure 2:
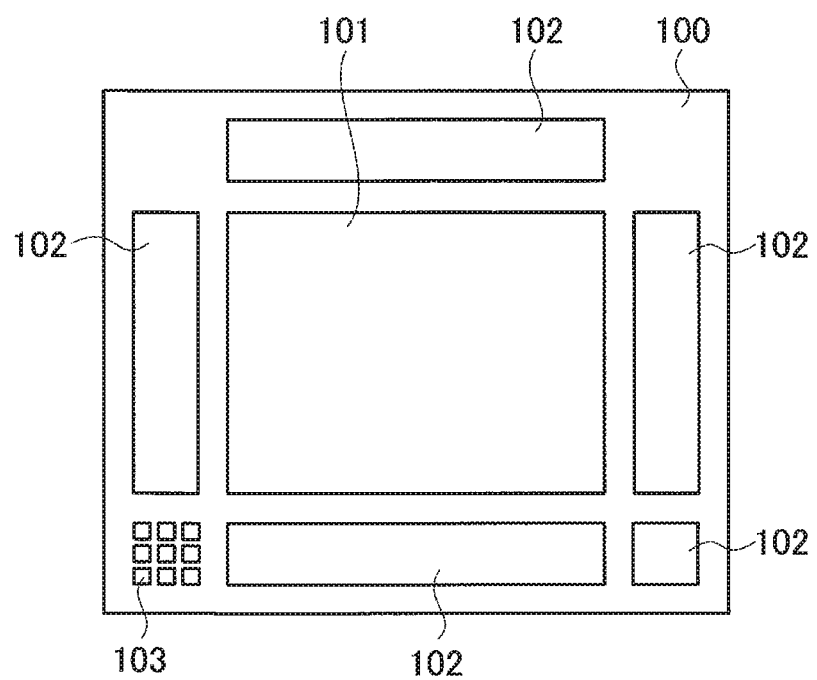
FIG. 2 is a view illustrating a configuration of the first substrate.

A configuration example of the substrate 100 will be described with reference to FIG. 2. FIG. 2 illustrates a front surface of the substrate 100. The substrate 100 includes a pixel region 101 (first pixel region) where a plurality of pixels are regularly arranged, a peripheral circuit 102 (first peripheral circuit) that is arranged around the pixel region 101 to perform drive control of each pixel, and a pad 103 (first pad) that is connected to the substrate 200.

The peripheral circuit 102 includes a driver circuit that drives each pixel, a control circuit that controls the driver circuit, and a power supply circuit. The peripheral circuit 102 may be constituted by a CMOS (Complementary Metal Oxide Semiconductor) circuit.

Figure 3:
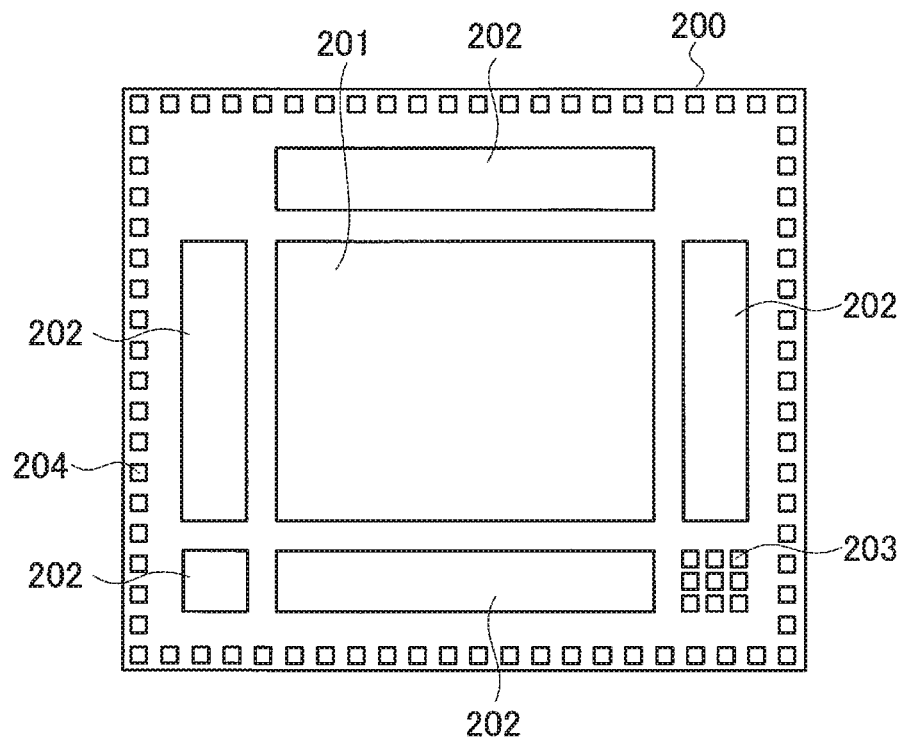
FIG. 3 is a view illustrating a configuration of the second substrate.

A configuration example of the substrate 200 will be described with reference to FIG. 3. FIG. 3 illustrates a front surface of the substrate 200. The substrate 200 includes a pixel region 201 (second pixel region) where a plurality of pixels are regularly arranged, a peripheral circuit 202 (second peripheral circuit) that is arranged around the pixel region 201 to perform drive control of each pixel, and a pad 203 (second pad) that is connected to the substrate 100.

The peripheral circuit 202 includes a circuit that performs digital-to-analog conversion on each column, a digital-to-analog convertor that generates a high-performance ramp waveform necessary for the digital-to-analog conversion, a circuit that forms an image based on each optical signal (for example, various circuits such as white spot correction circuits, gradation setting circuits, or white balance setting circuits, a field memory, an image/moving picture compression circuit, and a circuit for serial communication with the outside), a power supply circuit, a timing adjustment circuit, a clock signal supply circuit. The peripheral circuit 202 may be constituted by a CMOS circuit. When the substrate 200 is made larger than the substrate 100, a pad 204 for connecting with the external circuit may be formed on an outer periphery of the substrate 200.

The substrate 100 and the substrate 200 are arranged such that the pixel region 101 illustrated in FIG. 2 faces the pixel region 201 illustrated in FIG. 3 and the pad 103 faces the pad 203. Therefore, an upper surface of the substrate 100 illustrated in FIG. 1 is a back surface of the substrate 100.

The pad 103 is electrically-connected to the pad 203 through the micro bumps, for example. Pixels of the pixel region 101 are connected to pixels of the pixel region 201 through the micro bumps, respectively. That is, the substrate 100 is electrically-connected to the substrate 200 through the micro bumps. One unit pixel includes one pixel of the pixel region 101 and one pixel of the pixel region 201 electrically-connected to the one pixel of the pixel region 101.

Figure 4:
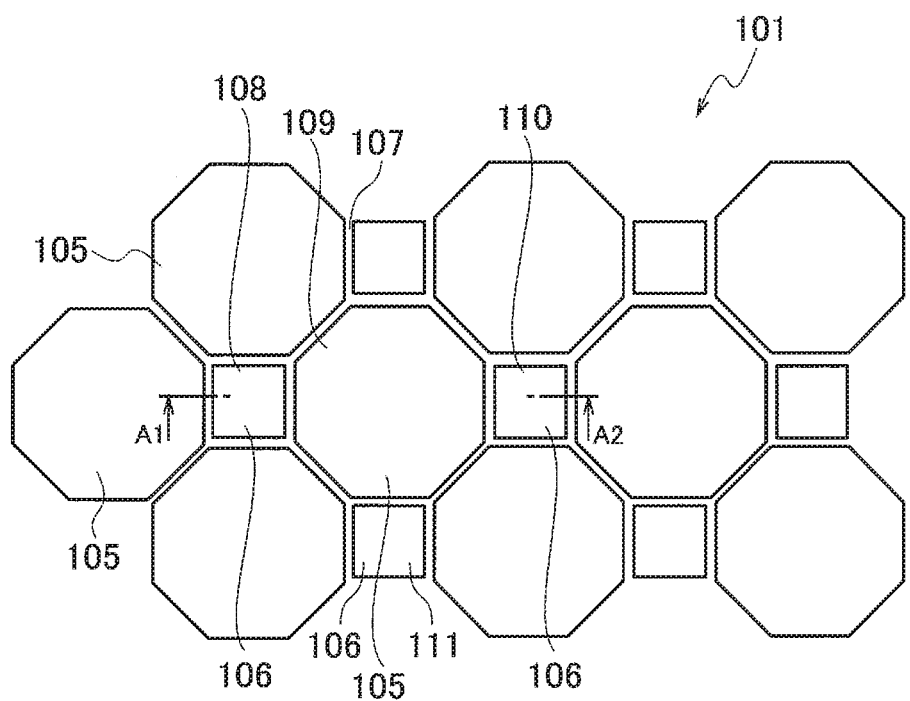
FIG. 4 is a view illustrating a configuration of photodiodes on the first substrate.

A configuration example of a photodiode in the pixel region 101 of the substrate 100 will be described with reference to FIG. 4. FIG. 4 illustrates the back surface of the substrate 100. The pixel region 101 includes a pixel (first pixel) in which a large photodiode 105 (first photodiode) is formed, and a pixel (second pixel) in which a small photodiode 106 (second photodiode) is formed. The solid-state imaging device 1 is a backside illumination solid-state imaging device in which external light is irradiated from the backside of the substrate 100.

The photodiode 105 includes an octagonal light receiving surface, for example. The photodiode 106 includes a rectangular light receiving surface that is smaller than the light receiving surface of the photodiode 105, for example. The photodiodes 105 and 106 are isolated from each other by an isolation region 107 such that mutual charges are not mixed. In FIG. 4, two kinds of photodiodes 105 and 106 are illustrated having different sizes for easy understanding, but the first pixel region 101 may be constituted by three or more kinds of photodiodes having different sizes.

Figure 5:
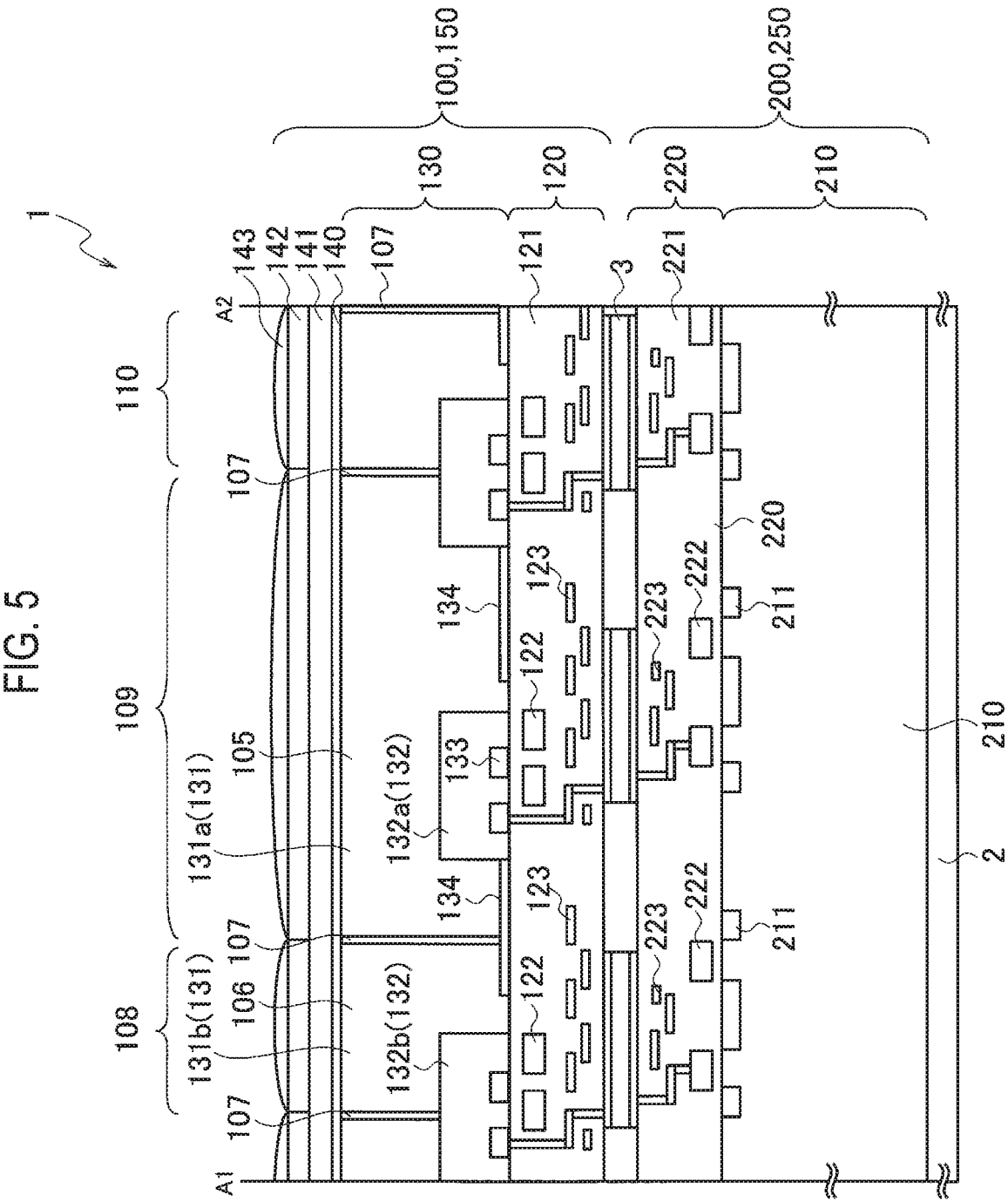
FIG. 5 is a sectional view of the solid-state imaging device taken along line A1-A2 in FIG. 4.

FIG. 5 illustrates cross-sections of pixels 108 to 110 in the solid-state imaging device 1 taken along line A1-A2 in FIG. 4. In FIG. 5, an upper part is the substrate 100, a central part is the substrate 200, and a lower part is the heat sinking plane 2.

The substrate 100 is electrically-connected to the substrate 200 at a connection portion 3. Pads of the pixel region 101 of the substrate 100 may be connected to pads of the pixel region 201 of the substrate 200 through the micro bumps, thereby forming the connection portion 3. The heat sinking plane 2 is fixed to the back surface of the substrate 200 (a lower surface in FIG. 5).

The substrate 100 includes a stacked structure in which a wiring region 120 (first wiring region), a light receiving region 130, a $p^+$-type region 140 (first $p^+$-type region), an insulating film 141 (first insulating film), a color filter 142, and a microlens 143 are stacked. As the color filter 142, a transparent filter, a red filter, a green filter, and a blue filter may be used. As the insulating film 141, a silicon oxide film may be used.

The light receiving region 130 is formed of a silicon substrate (silicon layer). The light receiving region 130 includes an n-type photoelectric conversion region 131, a p-type well 132, an $n^+$-type region 133, and a $p^+$-type region (second $p^+$-type region) 134.

In the pixel 109, a photoelectric conversion region 131a and a p-type well 132a constitute the photodiode 105 illustrated in FIG. 4. In the pixels 108 and 110, a photoelectric conversion region 131b and a p-type well 132b constitute the photodiode 106 illustrated in FIG. 4. The photodiode 105 is isolated from the photodiode 106 by the isolation region 107 in such a way that mutual charges are not mixed.

The isolation region 107 may be formed in such a manner that a resist mask is formed in a region other than the region for forming the isolation region 107 on the back surface (upper surface in FIG. 5) of the substrate 100, and is subjected to ion implantation. Alternatively, the isolation region 107 may be formed in such a manner that, for example, a silicon nitride film mask is formed in a region other than the region for forming the isolation region 107 on the back surface of the substrate 100, a region other than the silicon nitride film mask is etched to form a trench, and silicon oxide, silicon nitride, or polysilicon is buried in the trench.

A crystal structure of the photoelectric conversion region 131 may often be broken at an interface between the photoelectric conversion region 131 and the insulating film 141, and an interface between the photoelectric conversion region 131 and the wiring region 120. For this reason, a carrier of a non-optical signal is generated at these interfaces, thereby causing noise. Accordingly, it is possible to move the carrier of the non-optical signal to the $p^+$-type regions 134 and 140 by interposing the $p^+$-type regions 134 and 140 at these interfaces.

The wiring region 120 includes an insulating film 121 (second insulating film), a gate 122, and a metal wiring 123 (first metal wiring). The gate 122 and the metal wiring 123 are formed inside the insulating film 121. The p-type well 132, the $n^+$-type region 133 serving as a source and a drain, and the gate 122 constitute a MOSFET (MOS Field Effect Transistor) of the substrate 100. The substrate 100 has a pixel circuit 150 (first pixel circuit) including the photodiode 105 and the MOSFET.

External light is incident from the back side of the substrate 100. The external light passes through the microlens 143, the color filter 142, the insulating film 141, the $p^+$-type region 140 for each pixel, and is photoelectrically converted into an optical signal charge by the photodiodes 105 and 106. The optical signal charge is converted into voltage by the MOSFET formed in the substrate 100, and is output as an optical signal to the substrate 200 through the metal wiring 123 and the connection portion 3. The pixel circuit 150 is a photoelectric conversion circuit that photoelectrically converts incident light to generate an optical signal.

The substrate 200 has a stacked structure in which a p-type silicon substrate 210 and a wiring region 220 (second wiring region) are stacked. The wiring region 220 includes an insulating film 221 (third insulating film), a gate 222, and a metal wiring 223 (second metal wiring). The gate 222 and the metal wiring 223 are formed inside the insulating film 221.

The p-type silicon substrate 210 has an $n^+$-type region 211 serving as a source and a drain. The p-type silicon substrate 210, the $n^+$-type region 211, and the gate 222 constitute the MOSFET of the substrate 200. The insulating film 221, the gate 222, and the p-type silicon substrate 210 constitute a MOS capacitor of the substrate 200. The substrate 200 has a pixel circuit 250 (second pixel circuit) including the MOSFET and the MOS capacitor.

The optical signal output from the pixel circuit 150 through the connection portion 3 is held in the MOS capacitor of the pixel circuit 250, and is switch-controlled to be output by the MOSFET. The pixel circuit 250 is a signal holding circuit and an output circuit that holds and outputs the optical signal.

Each of the pixels 108 to 110 includes the pixel circuit 150 and the pixel circuit 250. The pixel circuits 250 are formed at equal intervals for each pixel. On the other hand, the photodiodes of the pixel circuit 150 have different sizes in pixel units. Specifically, the pixel circuit 150 is configured to include the pixel 109 (first pixel) having the large photodiode 105 and the pixels 108 and 110 (second pixels) having the small photodiode 106.

The MOSFET of the pixel circuit 150 and the pixel circuit 250 described above is an n-type MOSFET. A p-type MOSFET may be formed by setting conductivity types of each semiconductor constituting the MOSFET to reverse conductivity types (specifically, a p-type is set to an n-type, and an n-type is set to a p-type).

The solid-state imaging device 1 is a backside illumination solid-state imaging device in which the substrate 100 formed with the pixel circuit 150, including the photodiodes 105 and 106, is connected to the substrate 200 formed with the pixel circuit 250, and external light is incident from the back side of the substrate 100.

In the backside illumination solid-state imaging device 1, as compared to a front side illumination solid-state imaging device in which a first pixel circuit and a second pixel circuit are formed on a common substrate, the sizes of the photodiodes 105 and 106 can be made different for each pixel with respect to the pixel circuits 250, formed at equal intervals for each pixel. The sizes of the photodiodes 105 and 106 are determined by the position at which the isolation region 107 is formed.

Figure 6:
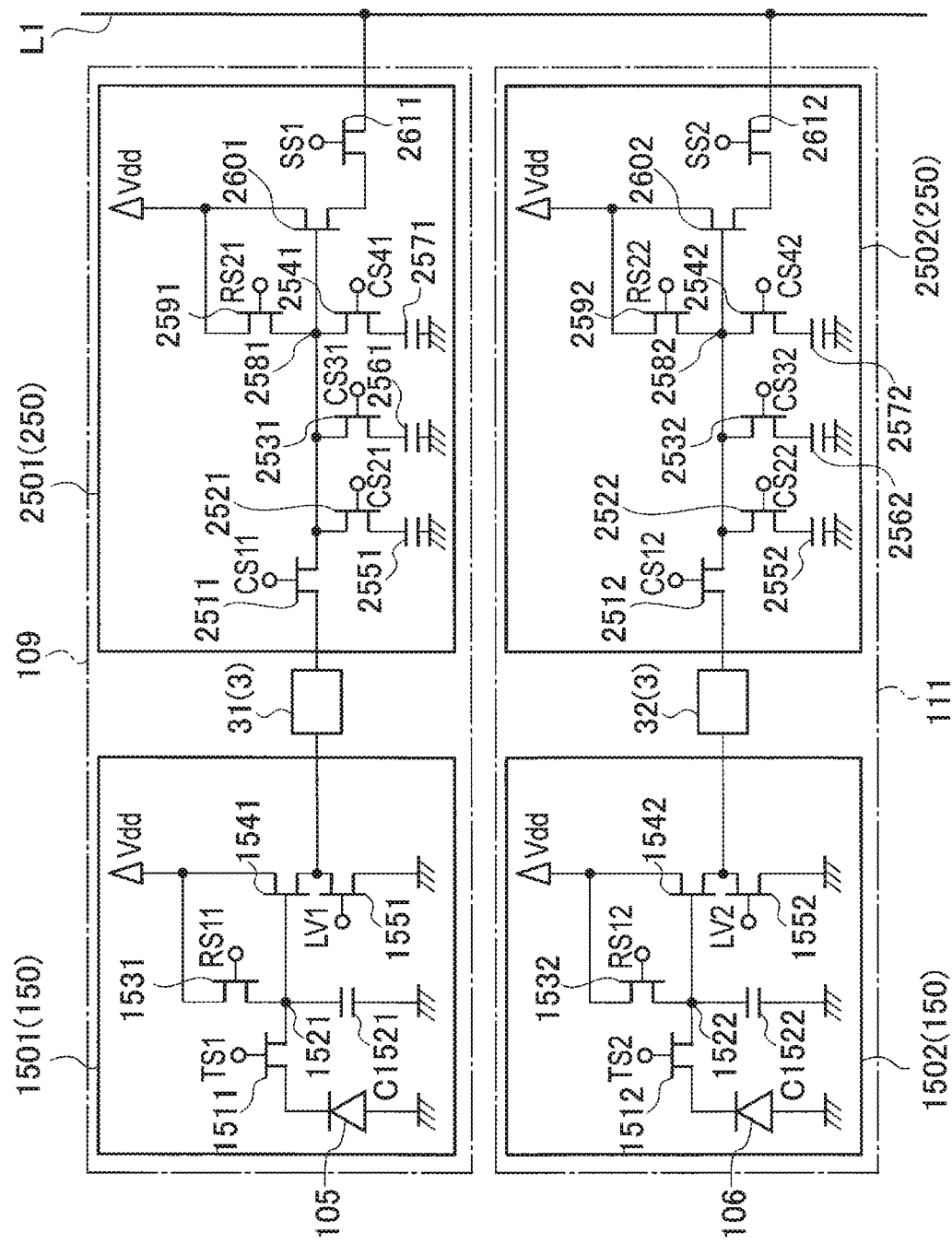
FIG. 6 is a circuit diagram illustrating a pixel circuit.

The pixel circuit will be described with reference to FIG. 6. In FIG. 6, two pixels are arranged in a vertical direction. An upper pixel is the pixel 109 having the photodiode 105 illustrated in FIG. 4 and a lower pixel is the pixel 111 having the photodiode 106 illustrated in FIG. 4, for example. The pixel 111 has the same structure as the pixels 108 and 110 illustrated in FIG. 5. In FIG. 6, for an easy understanding of the description, the pixel 109 is defined as a pixel corresponding to a first pixel row in a first pixel column, and the pixel 111 is defined as a pixel corresponding to a second pixel row in the first pixel column. The same reference numerals are given to the same constituent parts as those in FIGS. 1 to 5.

Each of the pixels 109 and 111 includes the first pixel circuit 150, the connection portion 3, and the second pixel circuit 250. In order to distinguish two pixels, in the pixel 109, the first pixel circuit is denoted by the reference numeral 1501, the connection portion is denoted by the reference numeral 31, and the second pixel circuit is denoted by the reference numeral 2501. In the pixel 111, the first pixel circuit is denoted by the reference numeral 1502, the connection portion is denoted by the reference numeral 32, and the second pixel circuit is denoted by the reference numeral 2502. The pixel 109 and the pixel 111 are described together because of having basically the same circuit configuration.

The first pixel circuits 1501 and 1502 include the photodiodes 105 and 106, transfer transistors (hereinafter, the transistor is referred to as Tr) 1511 and 1512, floating diffusions (hereinafter, referred to as FLDs) 1521 and 1522, and reset Trs (first reset Trs) 1531 and 1532, respectively.

In addition, the first pixel circuits 1501 and 1502 include amplifier Trs 1541 and 1542 (first amplifier Trs), and load Trs 1551 and 1552, respectively. The transfer Trs 1511 and 1512, the reset Trs 1531 and 1532, the amplifier Trs 1541 and 1542, and the load Trs 1551 and 1552 are MOSFETs formed on the substrate 100.

Each of the photodiodes 105 and 106 converts the incident light into hole-electron pairs. One of the hole electron pairs (for example, an electron) is accumulated in the photodiodes 105 and 106 as an optical signal charge. The transfer Trs 1511 and 1512 are controlled by transfer signals TS1 and TS2 output from the peripheral circuit 102.

When the transfer Trs 1511 and 1512 are turned on by the transfer signals TS1 and TS2, the optical signal charges accumulated in the photodiodes 105 and 106 are transferred to the FLDs 1521 and 1522. Each of the FLDs 1521 and 1522 is a minute stray capacitance constituted by a diffusion layer, and a potential thereof is reduced by the transferred optical signal charges (electrons). Stray capacitances of the FLDs 1521 and 1522 are defined as C1521 and C1522, respectively.

The reset Trs 1531 and 1532 are respectively controlled by reset signals RS11 and RS12 output from the peripheral circuit 102. When the reset Trs 1531 and 1532 are turned on by the reset signals RS11 and RS12, the FLDs 1521 and 1522 are reset.

The FLDs 1521 and 1522 are connected to gates of the amplifier Trs 1541 and 1542, respectively. The amplifier Trs 1541 and 1542 amplify the potential of the FLDs 1521 and 1522, respectively. The load Trs 1551 and 1552 respectively function as loads according to voltages LV1 and LV2 applied from the peripheral circuit 102. Voltages generated by the load Trs 1551 and 1552 are output as optical signals to the second pixel circuits 2501 and 2502 through the connection portions 31 and 32, respectively.

The second pixel circuits 2501 and 2502 include switching Trs 2511 and 2512 (first switching Trs), switching Trs 2521 and 2522 (second switching Trs), switching Trs 2531 and 2532 (third switching Trs), and switching Trs 2541 and 2542 (fourth switching Trs), respectively.

Further, the second pixel circuits 2501 and 2502 include capacitors 2551 and 2552 (first capacitors), capacitors 2561 and 2562 (second capacitors), capacitors 2571 and 2572 (third capacitors), nodes 2581 and 2582, reset Trs 2591 and 2592 (second reset Trs), amplifier Trs 2601 and 2602 (second amplifier Trs), and selective Trs 2611 and 2612, respectively.

The capacitors 2551 and 2552, the capacitors 2561 and 2562, and the capacitors 2571 and 2572 function as holding portions that hold the optical signals output from the first pixel circuits 1501 and 1502.

The switching Trs 2511, 2512, 2521, 2522, 2531, 2532, 2541, 2542, the reset Trs 2591 and 2592, the amplifier Trs 2601 and 2602, and the selective Trs 2611 and 2612 are MOSFETs formed on the substrate 200. The capacitors 2551, 2552, 2561, 2562, 2571, and 2572 are MOS capacitors formed on the substrate 200.

The switching Trs 2511 and 2512 are respectively controlled by control signals CS11 and CS12 output from the peripheral circuit 202. The first pixel circuits 1501 and 1502 are connected to each other when the switching Trs 2511 and 2512 are turned on by the control signals CS11 and CS12, respectively, and the connection between the first pixel circuits 1501 and 1502 is blocked when the switching Trs 2511 and 2512 are turned off.

The switching Trs 2521 and 2522 are respectively controlled by control signals CS21 and CS22 output from the peripheral circuit 202. The switching Trs 2521 and 2522 are respectively controlled by the control signals CS21 and CS22 to read and write the optical signal to and from the capacitors 2551 and 2552. The switching Trs 2531 and 2532 are respectively controlled by control signals CS31 and CS32 output from the peripheral circuit 202.

The switching Trs 2531 and 2532 respectively read and write the optical signal to and from the capacitors 2561 and 2562 by the control signals CS31 and CS32. The switching Trs 2541 and 2542 are respectively controlled by control signals CS41 and CS42 output from the peripheral circuit 202. The switching Trs 2541 and 2542 respectively read and write the optical signal to and from the capacitors 2571 and 2572 by the control signals CS41 and CS42.

The reset Trs 2591 and 2592 are respectively controlled by reset signals RS21 and RS22 output from the peripheral circuit 202. When the reset Trs 2591 and 2592 are turned on by the reset signals RS21 and RS22, the nodes 2581 and 2582 are reset. The nodes 2581 and 2582 are connected to gates of the amplifier Trs 2601 and 2602, respectively. The amplifier Trs 2601 and 2602 amplify potentials of the nodes 2581 and 2582, respectively.

The selective Trs 2611 and 2612 are respectively controlled by pixel selection signals SS1 and SS2 output from the peripheral circuit 202. When the selective Trs 2611 and 2612 are turned on by the pixel selection signals SS1 and SS2 a pixel is selected, and the optical signals are output from the amplifier Trs 2601 and 2602 of the selected pixel to a column signal line L1, through the selective Trs 2611 and 2612.

A row of pixels is connected to one column signal line L1. That is, the column signal line L1 is formed for each row of pixels. The pixels are sequentially selected by the selective Trs 2611 and 2612 in a row direction, and thus each optical signal is sequentially output to the column signal line L1 for the corresponding row of pixels.

Figure 7:
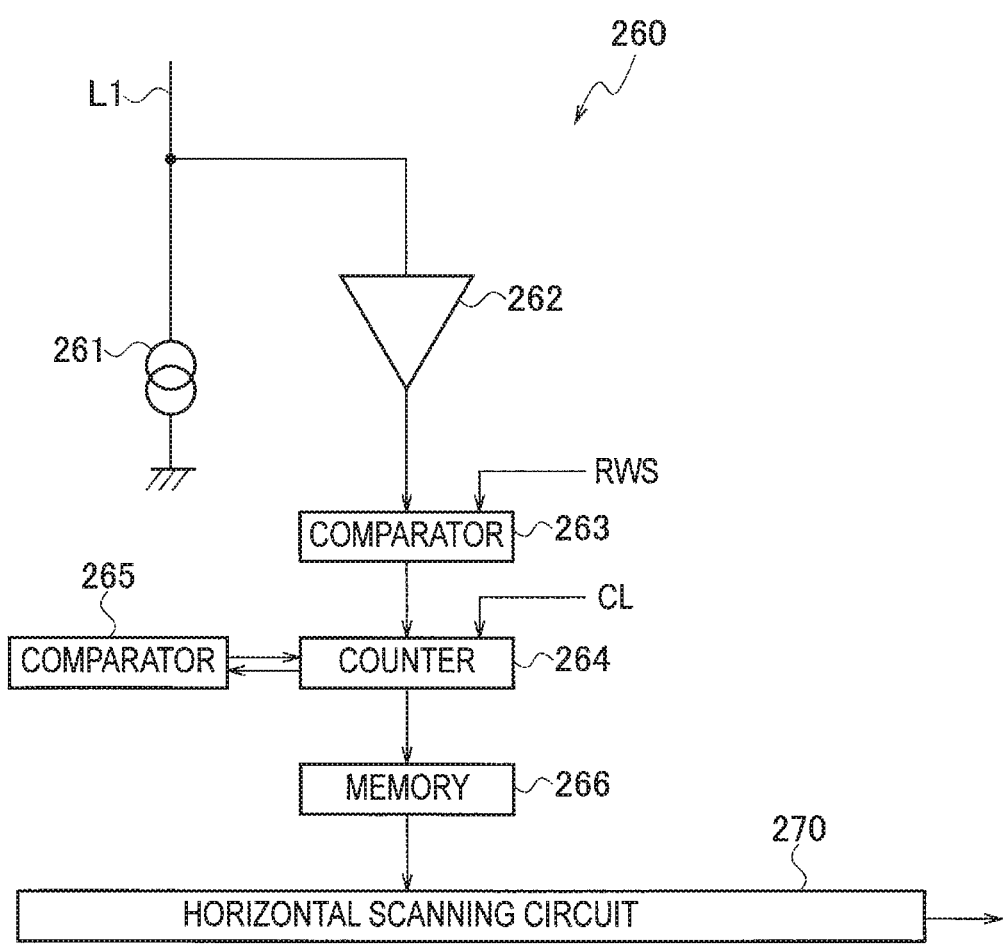
FIG. 7 is a view illustrating a configuration of a column processing circuit.

A column processing circuit connected to the column signal line L1 will be described with reference to FIG. 7. A column processing circuit 260 is formed in the peripheral circuit 202 of the substrate 200. The column processing circuit 260 includes a current source load 261, a programmable amplifier 262, a comparator 263 (first comparator), a counter 264, a comparator 265 (second comparator), and a memory 266. The comparator 263, the counter 264, and the comparator 265 constitute an analog-to-digital conversion circuit (hereinafter, referred to as an ADC circuit).

The current source load 261 is connected to the column signal line L1 and the programmable amplifier 262. The voltage (optical signal) generated by the current source load 261 is amplified by the programmable amplifier 262 and is then output to the comparator 263. A ramp waveform signal RWS, which is an analog signal, is input to the comparator 263 from the peripheral circuit 202. The comparator 263 compares a voltage value of the optical signal output from the programmable amplifier 262 with a voltage value of the ramp waveform signal RWS, and outputs a coinciding pulse signal to the counter 264 when both of the voltage values coincide with each other, thereby stopping counting.

A clock signal CL is input to the counter 264 from the peripheral circuit 202. The counter 264 is an up-down counter, which can count both in the direction in which the number decreases and in the direction in which the number increases. For example, the counter 264 counts the clock signal CL with the down counter, and counts the optical signal with the up counter, thereby executing a CDS (Correlated Double Sampling) process.

The comparator 265 controls an operation of the counter 264. The comparator 265 compares the count value of the counter 264 with a predetermined value set in advance, and determines the next operation of the counter 264. A specific control method of the comparator 265 will be described below.

The count value, which is CDS-processed by the counter 264, is stored in the memory 266. The control is performed by the comparator 265 to enlarge a dynamic range. Therefore, when the dynamic range is not required to be enlarged, the control may not be performed by the comparator 265.

The column processing circuit 260 is arranged for each row of pixels. The horizontal scanning circuit 270 is connected to the plurality of column processing circuits 260 for each row of pixels. The horizontal scanning circuit 270 is formed in the peripheral circuit 202 of the substrate 200. The count value (optical signal) stored in the memory 266 is output to the horizontal scanning circuit 270 from the plurality of column processing circuits 260 for each row of pixels. The horizontal scanning circuit 270 sequentially outputs the optical signal corresponding to each of the pixels.

Figure 8:
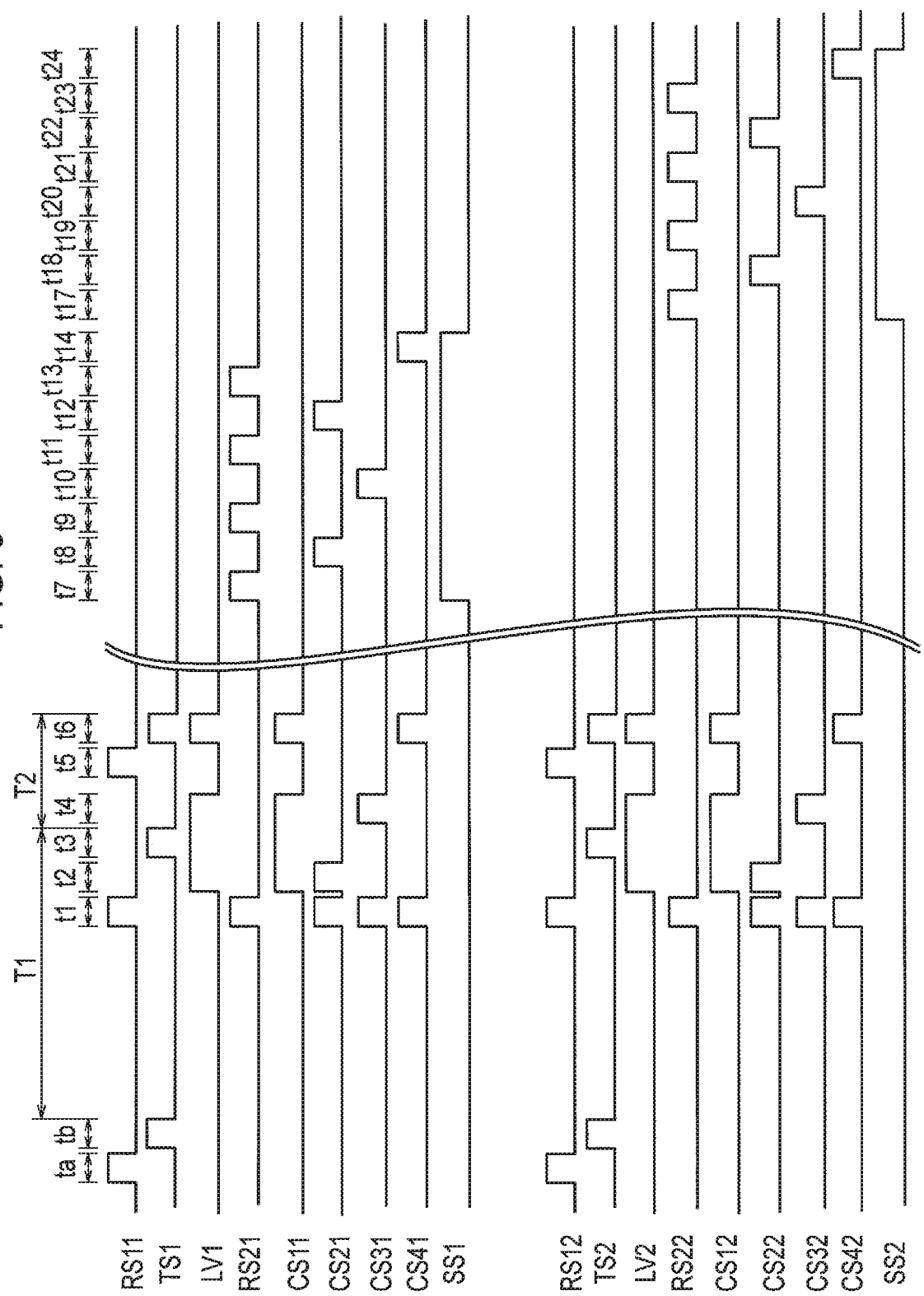
FIG. 8 is a timing chart for explaining an operation of the pixel circuit.

An operation of the pixel circuit illustrated in FIG. 6, specifically, a global shutter operation, will be described with reference to FIG. 8. The global shutter operation includes an accumulation process of simultaneously accumulating the optical signals in all of the pixels and a reading process of reading the optical signal of each pixel. In FIG. 8, a time chart of an upper stage (range from RS11 to SS1) indicates a time chart in the pixel circuit of the upper-stage pixel 109 illustrated in FIG. 6. In FIG. 8, a time chart of a lower stage (range from RS12 to SS2) indicates a time chart in the pixel circuit of the lower-stage pixel 111 illustrated in FIG. 6.

The accumulation process of all of the pixels proceeds for a period from an end time point of a period tb to an end time point of a period t6. The reading process of the pixel 109 proceeds for a period from a start time point of a period t7 to an end time point of a period t14. The reading process of the pixel 111 proceeds for a period from a start time point of a period t17 to an end time point of a period t24.

In an initial operation, the reset Trs 1531 and 1532 are respectively turned on by the reset signals RS11 and RS12 at a period ta, and the FLDs 1521 and 1522 are reset. At the period tb, the transfer Trs 1511 and 1512 are respectively turned on by the transfer signals TS1 and TS2, and the photodiodes 105 and 106 are reset. The resetting of the FLDs 1521 and 1522 and the resetting of the photodiodes 105 and 106 may be performed in the same period.

In the accumulation process, a period from the end time point of the period tb to an end time point of a period t3 is defined as a first exposure time T1, and a period from the end time point of the period t3 to the end time point of the period t6 is defined as a second exposure time T2. That is, the period of the accumulation process includes the first exposure time T1 and the second exposure time T2. The first exposure time T1 is set to be longer than the second exposure time T2.

At the period t1, all of the pixels are simultaneously reset. Specifically, the reset Trs 1531 and 1532 are respectively turned on by the reset signals RS11 and RS12, and the FLDs 1521 and 1522 are reset. The reset Trs 2591 and 2592 are respectively turned on by the reset signals RS21 and RS22, and the nodes 2581 and 2582 are reset.

The switching Trs 2521 and 2522 are respectively turned on by the control signals CS21 and CS22, and the capacitors 2551 and 2552 are reset. The switching Trs 2531 and 2532 are respectively turned on by the control signals CS31 and CS32, and the capacitors 2561 and 2562 are reset. The switching Trs 2541 and 2542 are respectively turned on by the control signals CS41 and CS42, and the capacitors 2571 and 2572 are reset.

Since the optical signals are respectively written to the capacitors 2551 and 2552, the capacitors 2561 and 2562, and the capacitors 2571 and 2572 by the voltages generated in the load Trs 1551 and 1552 by the amplifier Trs 1541 and 1542, resetting may not be performed. However, when the optical signals are written to the capacitors 2551 and 2552, the capacitor 2561 and 2562, and the capacitors 2571 and 2572, respectively, there may be slight deviation between the case of writing in the down direction from a high voltage and the case of writing in the up direction from a low voltage. In order to avoid such a problem, each of the capacitors is preferably reset to match the voltage (Vdd) in the high direction.

The potentials of the reset FLDs 1521 and 1522 become reference potentials of the pixel. At a start time point of the period t2, the voltages LV1 and LV2 are applied to the load Trs 1551 and 1552, respectively, and thus the load Trs 1551 and 1552 operate as a current source. Thus, current flows to the amplifier Trs 1541 and 1542, the amplifier Trs 1541 and 1542, and the load Trs 1551 and 1552 operate as a source follower circuit.

At the period t2, the switching Trs 2511 and 2512 are respectively turned on by the control signals CS11 and CS12, the switching Trs 2521 and 2522 are respectively turned on by the control signals CS21 and CS22, and the potentials (reference potential) of the FLDs 1521 and 1522 are held in the capacitors 2551 and 2552, respectively.

The first exposure time T1 is a time until the optical signal charges (electrons) photoelectrically converted by the photodiodes 105 and 106 are transferred after being accumulated. The optical signal charges photoelectrically converted at the first exposure time T1 are accumulated in the photodiodes 105 and 106.

At the period t3, the transfer Trs 1511 and 1512 are turned on by the transfer signals TS1 and TS2, respectively, and the optical signal charges accumulated in the photodiodes 105 and 106 are transferred to the FLDs 1521 and 1522 (stray capacitances C1521 and C1522), respectively. The potentials of the FLDs 1521 and 1522 fluctuate according to the transferred optical signal charges (the potential decreases when the optical signal charges are electrons). The potentials of the FLDs 1521 and 1522, which fluctuated according to the transferred optical signal charges, become an optical signal (first optical signal) of the first exposure time T1.

At the period t4, the switching Trs 2531 and 2532 are turned on by the control signals CS31 and CS32, respectively, and the optical signal obtained at the first exposure time T1 is held in the capacitors 2561 and 2562, respectively. At an end time point of the period t4, the applying of the voltages LV1 and LV2 to the load Trs 1551 and 1552 is stopped. Consequently, recording of the optical signal at the first exposure time T1 is completed for all of the pixels.

At the period t3, the optical signal charges accumulated in the photodiodes 105 and 106 are transferred to the FLDs 1521 and 1522. Accordingly, the second exposure time T2 is started from the end time point of the period t3. At the period t5, the reset Trs 1531 and 1532 are turned on by the reset signals RS11 and RS12, respectively, and the FLDs 1521 and 1522 are reset.

At the period t6, the voltages LV1 and LV2 are applied to the load Trs 1551 and 1552, respectively, and thus the load Trs 1551 and 1552 operate as a current source. Thus, current flows to the amplifier Trs 1541 and 1542, and the amplifier Trs 1541 and 1542 and the load Trs 1551 and 1552 operate as a source follower circuit.

Further, at the period t6, the transfer Trs 1511 and 1512 are turned on by the transfer signals TS1 and TS2, and the optical signal charges accumulated in the photodiodes 105 and 106 are transferred to the FLDs 1521 and 1522, respectively. The potentials of the FLDs 1521 and 1522 fluctuate according to the transferred optical signal charges. The potentials of the FLDs 1521 and 1522, which fluctuate according to the transferred optical signal charges, become an optical signal (second optical signal) of the second exposure time T2.

At the period t6, the switching Trs 2511 and 2512 are turned on by the control signals CS11 and CS12, respectively, the switching Trs 2541 and 2542 are turned on by the control signals CS41 and CS42, respectively, and the optical signal obtained at the second exposure time T2 is held in the capacitors 2571 and 2572.

At the end time point of the period t6, the applying of the voltages LV1 and LV2 to the load Trs 1551 and 1552 is stopped. Consequently, recording of the optical signal at the second exposure time T2 is completed for all of the pixels. The next first exposure time T1 after the end of the second exposure time T2 is a period from the end time point of the period t6 to an end time point of the next period t3.

Figure 9:
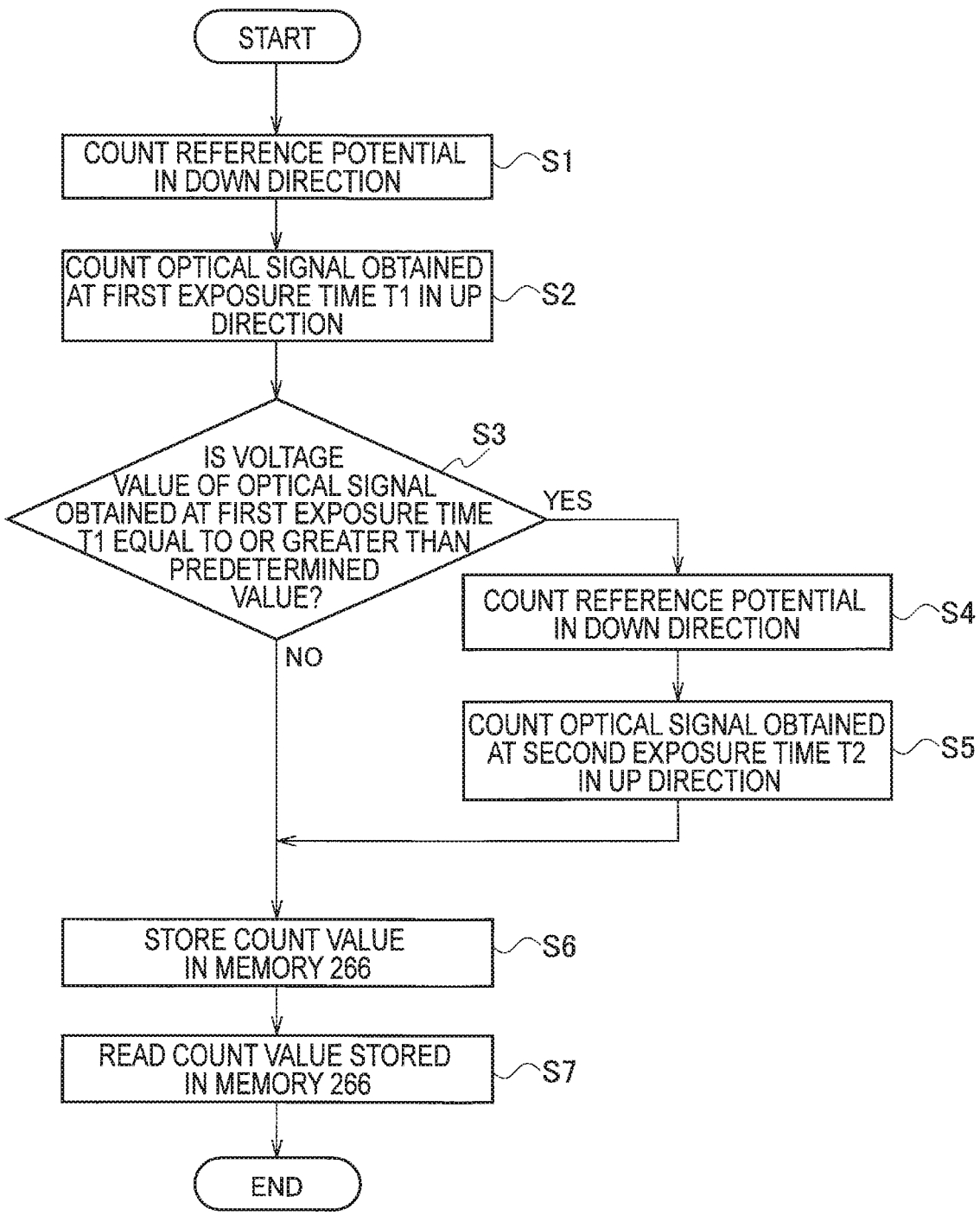
FIG. 9 is a flowchart for explaining an operation of the column processing circuit.

The reading process will be described with reference to FIGS. 8 and 9. FIG. 9 illustrates a flowchart of a process executed by the column processing circuit 260. First, the reading process of the pixel 109 in the first pixel row will be described.

At the start time point of the period t7, the selective Tr 2611 is turned on by the pixel selection signal SS1, and the pixel 109 is selected. In addition, at the period t7, the reset Tr 2591 is turned on by the reset signal RS21, and the node 2581 is reset.

At the period t8, the switching Tr 2521 is turned on by the control signal CS21, and the reference potential held in the capacitor 2551 is charged in the node 2581. Since capacitance of the capacitor 2551 is sufficiently larger than stray capacitance of the node 2581, the potential of the node 2581 becomes substantially the same as the voltage level of the capacitor 2551. The potential (reference potential) of the node 2581 is amplified by the amplifier Tr 2601, and is output to the column processing circuit 260 through the selective Tr 2611 and the column signal line L1.

The voltage generated by the current source load 261 of the column processing circuit 260 is amplified by the programmable amplifier 262, and is output to the comparator 263 as an optical signal. The counter 264 is reset in advance.

In step S1 of FIG. 9, the counter 264 counts the optical signal (reference potential), which is output from the comparator 263, in the down direction. The comparator 263 compares the output value of the programmable amplifier 262 with the ramp waveform signal RWS, and outputs the coinciding pulse signal to the counter 264 when both of the values coincide with each other, thereby stopping counting. The count value when the coinciding pulse signal is input becomes a count value indicating the reference potential at the first exposure time T1.

At the period t9, the reset Tr 2591 is turned on by the reset signal RS21, and the node 2581 is reset. At the period t10, the switching Tr 2531 is turned on by the control signal CS31, and the optical signal obtained at the first exposure time T1 held in the capacitor 2551 is charged in the node 2581. The potential of the node 2581 is amplified by the amplifier Tr 2601, and is output to the column processing circuit 260 through the selective Tr 2611 and the column signal line L1.

In step S2, the counter 264 counts the optical signal obtained at the first exposure time T1, which is output from the comparator 263, in the up direction. The comparator 263 compares the output value of the programmable amplifier 262 with the ramp waveform signal RWS, and outputs the coinciding pulse signal to the counter 264 when both of the values coincide with each other, thereby stopping counting. The count value when the coinciding pulse signal is input becomes a count value indicating the voltage value of the optical signal obtained at the first exposure time T1.

The counter 264 counts in the down direction at the period t8, and counts in the up direction at the period t10. Therefore, the counter 264 acquires a difference between the reference potential and the voltage value of the optical signal obtained at the first exposure time T1. That is, the counter 264 performs the CDS process on the optical signal obtained at the first exposure time T1.

In step S3, the comparator 265 compares the voltage value (count value) of the optical signal obtained at the first exposure time T1, which is subjected to the CDS process, with a predetermined value set in advance, and determines whether the voltage value of the optical signal obtained at the first exposure time T1 is equal to or greater than the predetermined value. The comparator 265 outputs an instruction signal to the counter 264 based on the determination result.

Specifically, when it determines that the voltage value of the optical signal obtained at the first exposure time T1 is equal to or greater than the predetermined value (YES), the comparator 265 outputs an instruction signal, which instructs to add the optical signal obtained at the second exposure time T2 to the optical signal obtained at the first exposure time T1, to the counter 264. When it determines that the voltage value of the optical signal obtained at the first exposure time T1 is not equal to or greater than the predetermined value (NO), the comparator 265 outputs an instruction signal, which instructs not to add the optical signal obtained at the second exposure time T2 to the optical signal obtained at the first exposure time T1, to the counter 264.

In addition, kTC noise (reset noise) occurs in the stray capacitance C1521 of the FLD 1521. Since the stray capacitance C1521 is very small, the noise level of the kTC noise increases. The noise level of the kTC noise occurring in the stray capacitance C1521 is, for example, about 50 to 100 as the number of electrons. As the optical signal obtained at the first exposure time T1 is added with the kTC noise, the noise level increases.

The optical signal obtained at the first exposure time T1 includes noise caused by leak current of the capacitor, and shot noise caused by the circuit. When the noise level of the optical signal obtained at the first exposure time T1 is equal to or higher than the voltage value of the optical signal obtained at the second exposure time T2, since the noise level of the optical signal obtained at the first exposure time T1 is large, the optical signal obtained at the second exposure time T2 may be added to the optical signal obtained at the first exposure time T1. The leak current largely varies for each pixel. On the other hand, since the shot noise is equal to the square root of the optical signal and its magnitude is clear, a predetermined value is set in view of the shot noise.

Figure 10:
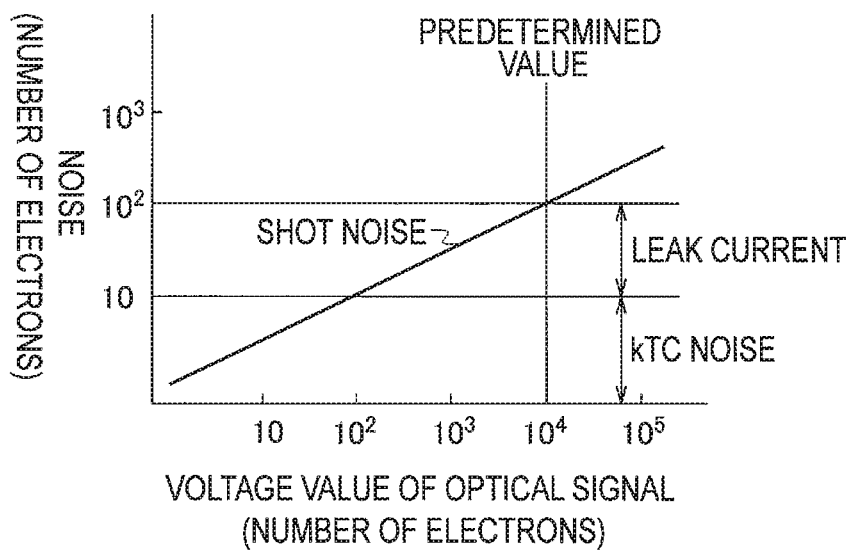
FIG. 10 is a diagram illustrating a relation between an optical signal and shot noise at the first exposure time T1.

A method of setting the predetermined value will be described with reference to FIG. 10. In FIG. 10, a horizontal axis indicates the voltage value (value converted into the number of electrons) of the optical signal obtained at the first exposure time T1, and a vertical axis indicates the noise level (value converted into the number of electrons) of the shot noise with respect to the optical signal obtained at the first exposure time T1. In FIG. 10, kTC noise and leak current indicate the kTC noise included in the optical signal obtained at the first exposure time T1 and the noise caused by the leak current.

The total of the kTC noise and the noise caused by the leak current is about 100 as the number of electrons. The voltage value of the optical signal obtained at the first exposure time T1, at which these types of noise and the shot noise are equal in noise level, is about 10000 as the number of electrons. Therefore, the predetermined value is set to 10000 as the number of electrons.

In step S3 of FIG. 9, when it determines that the voltage value of the optical signal obtained at the first exposure time T1 is equal to or greater than the predetermined value (YES), the comparator 265 outputs an instruction signal, which instructs to add the optical signal obtained at the second exposure time T2 to the optical signal obtained at the first exposure time T1, to the counter 264. The counter 264 adds the optical signal obtained at the second exposure time T2 to the optical signal obtained at the first exposure time T1, based on the instruction signal.

Specifically, at the period t11 in FIG. 8, the reset Tr 2591 is turned on by the reset signal RS21, and the node 2581 is reset. At the period t12, the switching Tr 2521 is turned on by the control signal CS21, and the reference potential at the first exposure time T1 held in the capacitor 2551 is charged in the node 2581. The potential of the node 2581 is amplified by the amplifier Tr 2601, and is output to the column processing circuit 260 through the selective Tr 2611 and the column signal line L1.

The voltage generated by the current source load 261 of the column processing circuit 260 is amplified by the programmable amplifier 262, and is output to the comparator 263.

In step S4 of FIG. 9, the counter 264 counts the optical signal (reference potential), which is output from the comparator 263, in the down direction. The comparator 263 compares the output value of the programmable amplifier 262 with the ramp waveform signal RWS, and outputs the coinciding pulse signal to the counter 264 when both of the values coincide with each other, thereby stopping counting. The count value when the coinciding pulse signal is input becomes a count value indicating the reference potential at the second exposure time T2.

At the period t13, the reset Tr 2591 is turned on by the reset signal RS21, and the node 2581 is reset. At the period t14, the switching Tr 2541 is turned on by the control signal CS41, and the optical signal obtained at the second exposure time T2 held in the capacitor 2571 is charged in the node 2581.

The potential of the node 2581 is amplified by the amplifier Tr 2601, and is output to the column processing circuit 260 through the selective Tr 2611 and the column signal line L1. Thereafter, the selective Tr 2611 is turned off, and the selection of the pixel 109 is completed.

In step S5, the counter 264 counts the optical signal obtained at the second exposure time T2, which is output from the comparator 263, in the up direction. The comparator 263 compares the output value of the programmable amplifier 262 with the ramp waveform signal RWS, and outputs the coinciding pulse signal to the counter 264 when both of the values coincide with each other, thereby stopping counting. The count value when the coinciding pulse signal is input becomes a count value indicating the voltage value of the optical signal obtained at the second exposure time T2.

The counter 264 counts in the down direction at the period t12, and counts in the up direction at the period t14. Therefore, the counter 264 acquires a difference between the reference potential and the voltage value of the optical signal obtained at the second exposure time T2. That is, the counter 264 performs the CDS process on the optical signal obtained at the second exposure time T2. The counter 264 adds the optical signal obtained at the second exposure time T2 subjected to the CDS process to the optical signal obtained at the first exposure time T1 subjected to the CDS process.

In step S3 of FIG. 9, when it determines that the voltage value of the optical signal obtained at the first exposure time T1 is not equal to or greater than the predetermined value (NO), the comparator 265 outputs an instruction signal, which instructs not to add the optical signal obtained at the second exposure time T2 to the optical signal obtained at the first exposure time T1, to the counter 264. The counter 264 does not perform the adding operation based on the instruction signal.

Specifically, the counter 264 stops the counting operation during the period at which the optical signal obtained at the second exposure time T2 is output to the column signal line L1, that is, the period from the start time point of the period t11 to the end time point of the period t13. Thus, only the count value of the optical signal obtained at the first exposure time T1 remains in the counter 264.

In step S6, the counter 264 causes the memory 266 to store the count value. Since the above process is performed in parallel for all of the pixels in the pixel row, for example, the count value of each pixel is stored in the memory 266 of all of the pixels in the first pixel row. In step S7, the horizontal scanning circuit 270 sequentially reads the count value of each pixel stored in the memory 266 of all of the pixels in the first pixel row, as an optical signal (pixel signal), for each column signal line. Thus, the reading process of the optical signal for the first pixel row is completed.

Figure 11:
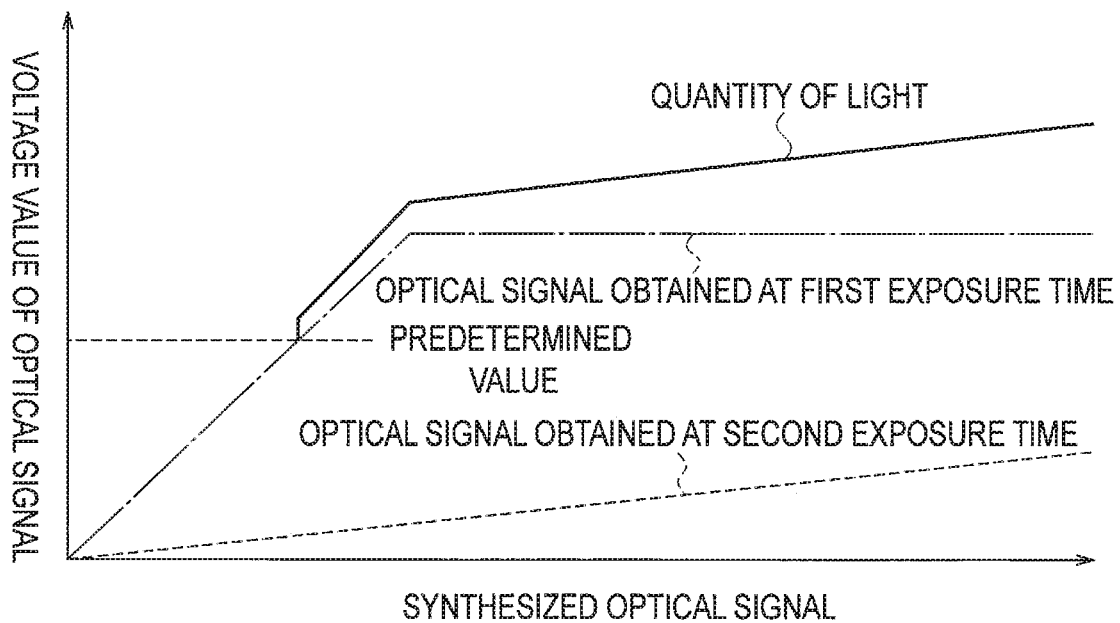
FIG. 11 is a diagram illustrating a relation between an optical signal read out to a horizontal scanning circuit and the quantity of incident light.

A relation between the optical signal of the pixel read out to the horizontal scanning circuit 270, and the quantity of light incident on the pixel will be described with reference to FIG. 11. In FIG. 11, a vertical axis indicates a voltage value of the optical signal of the pixel read out to the horizontal scanning circuit 270, and a horizontal axis indicates the quantity of light incident on the pixel.

When the voltage value of the optical signal obtained at the first exposure time T1 is equal to or greater than the predetermined value, the optical signal read out to the horizontal scanning circuit 270 becomes a signal of a voltage value obtained by adding the voltage value of the optical signal obtained at the second exposure time T2 to the voltage value of the optical signal obtained at the first exposure time T1. Since the first exposure time T1 is longer than the second exposure time T2, the voltage value of the optical signal of the first exposure time T1 is saturated beforehand even in the case of the same quantity of light. Even when the voltage value of the optical signal obtained at the first exposure time T1 is saturated beforehand, the voltage value of the optical signal obtained at the second exposure time T2 increases according to the quantity of light. Accordingly, it is possible to expand a dynamic range by adding the optical signal obtained at the second exposure time T2 to the optical signal obtained at the first exposure time T1.

When the voltage value of the optical signal obtained at the first exposure time T1 is less than the predetermined value, the optical signal read out to the horizontal scanning circuit 270 becomes the optical signal obtained at the first exposure time T1.

When the reading of the pixel 109 in the first pixel row is completed, reading of the pixel 111 in the second pixel row is started. Similarly to the reading process of the pixel 109 in the first pixel row from the period t7 to the period t14, the reading process is also performed on the pixel 111 in the second pixel row from the period t17 to the period t24, and then the reading process of the pixel 111 in the second pixel row is completed. The same reading process is performed on a third pixel row and subsequent pixel rows, and thus the reading process for one image is completed.

Figure 12:
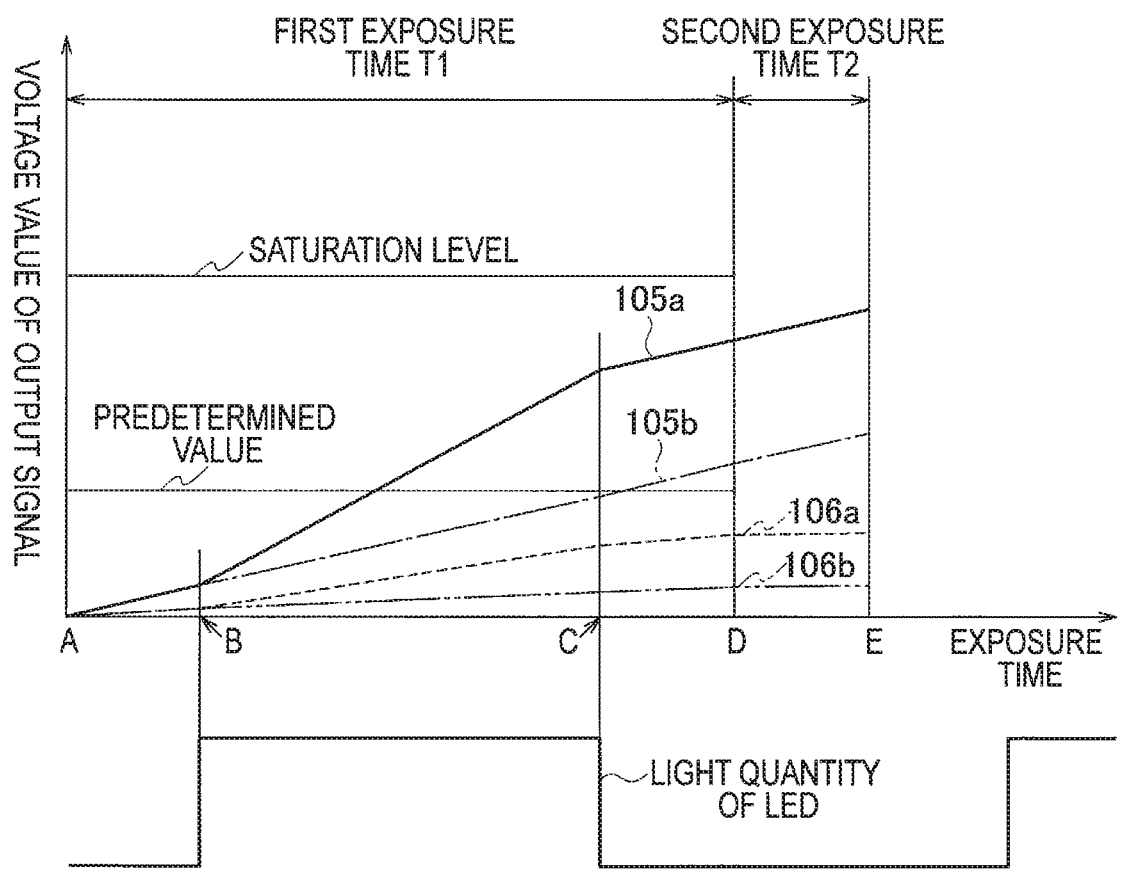
FIG. 12 is a diagram illustrating a relation between an exposure time and an output signal of photodiodes having different sizes in a case of capturing in a dark place.
Figure 13:
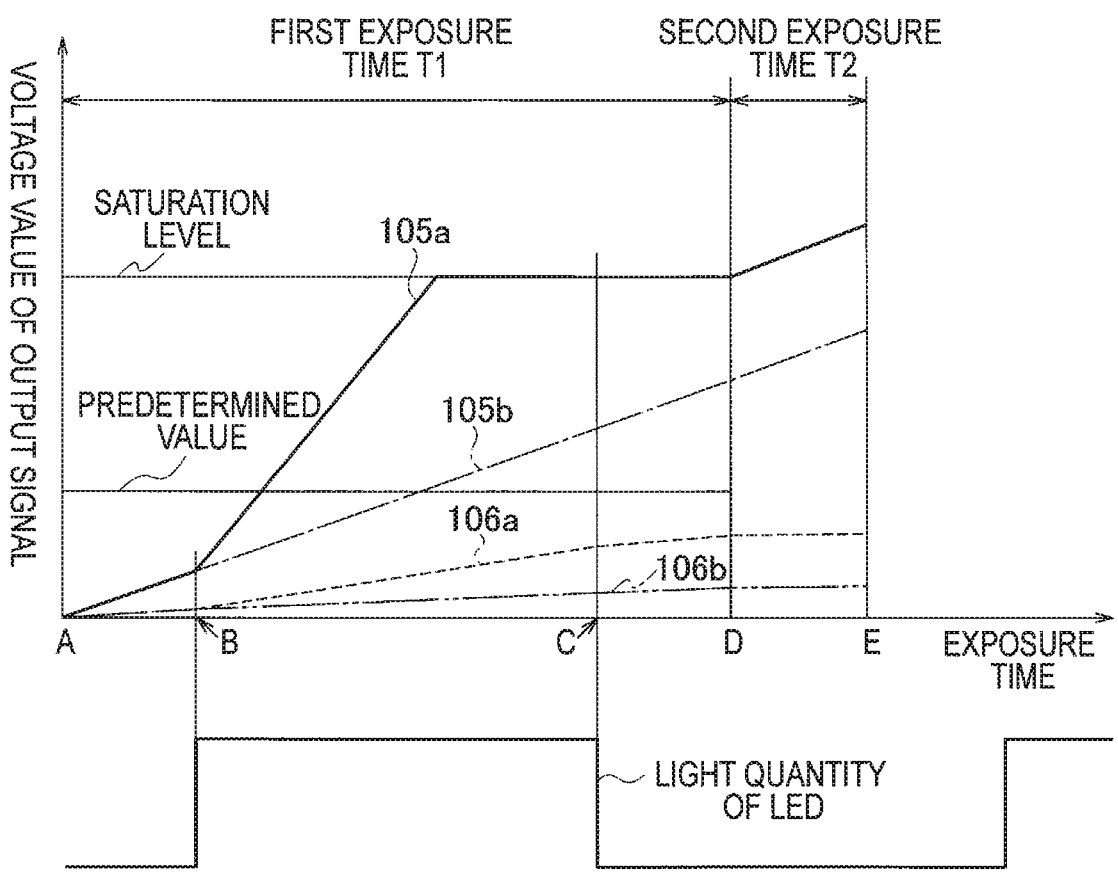
FIG. 13 is a diagram illustrating a relation between the exposure time and the output signal of photodiodes having different sizes in a case of capturing in an intermediate bright place.
Figure 14:
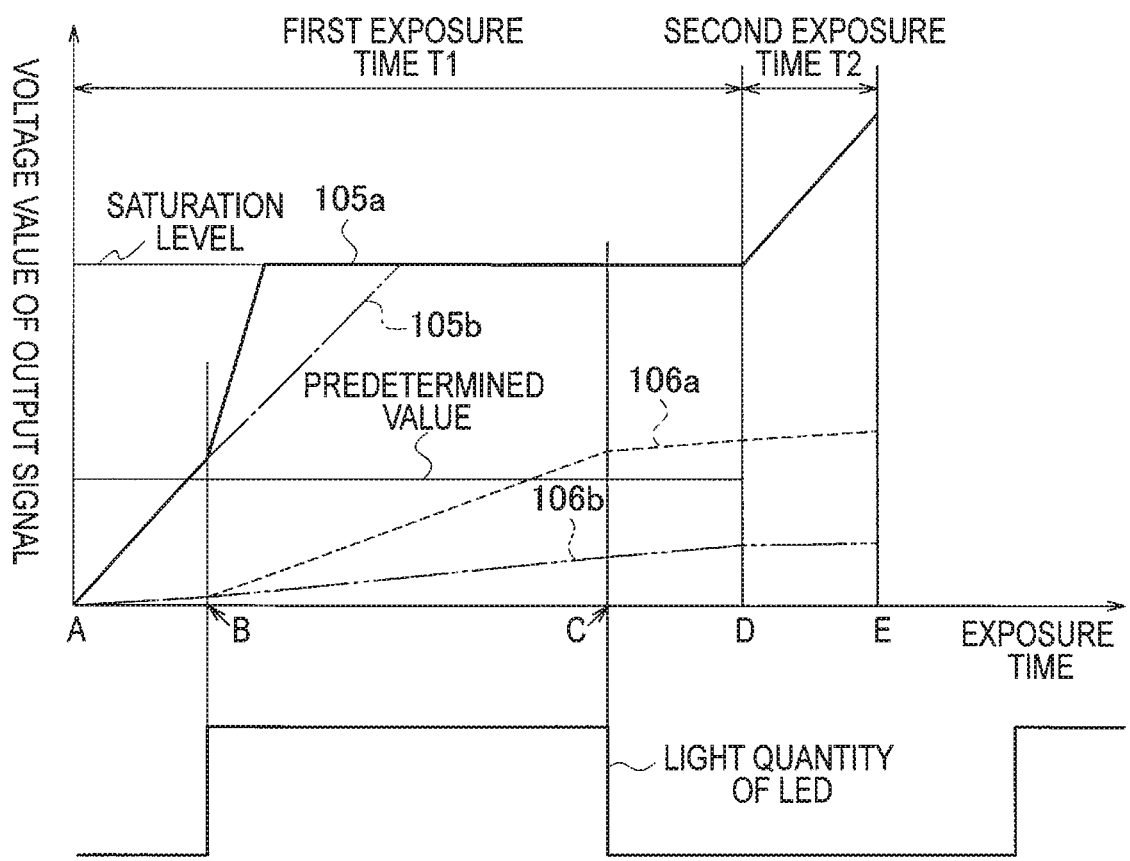
FIG. 14 is a diagram illustrating a relation between the exposure time and the output signal of photodiodes having different sizes in a case of capturing in a very bright place.

The reason why the influence of LED flicker can be suppressed by photodiodes having different sizes will be described with reference to FIGS. 12 to 14. In FIGS. 12 to 14, a horizontal axis indicates an exposure time, and a vertical axis indicates the voltage value of the optical signal (hereinafter, referred to as an output signal) read out to the horizontal scanning circuit 270. In FIGS. 12 to 14, a period from a time point A to a time point D is set as the first exposure time T1, and a period from the time point D to a time point E is set as the second exposure time T2.

In a case where the solid-state imaging device 1 is used to be mounted on a vehicle, the solid-state imaging device 1 captures a display image of an LED display device such as a traffic light. In the LED display device, since the light quantity of LED is normally adjusted by PWM, a flickering operation is performed. In FIGS. 12 to 14, the light quantities of LEDs of the LED display device are illustrated. In FIGS. 12 to 14, a period from the time point A to the time point B and a period from the time point C to the time point E are set as periods during which the LED display device is turned off, and a period from the time point B to the time point C is set as a period during which the LED display device is turned on.

The solid-state imaging device 1 includes photodiodes of different sizes, for example, the large photodiodes 105 and small photodiodes 106 as illustrated in FIG. 4. In order to distinguish the respective photodiodes, it is assumed that a large photodiode (first large photodiode) receiving the LED light is defined as the reference numeral 105a and a large photodiode (second large photodiode) not receiving the LED light is defined as the reference numeral 105b. In addition, it is assumed that a small photodiode (first small photodiode) receiving the LED light is defined as the reference numeral 106a and a small photodiode (second small photodiode) not receiving the LED light is defined as the reference numeral 106b.

FIG. 12 illustrates a case where capturing is performed in a dark place, specifically, a case where neither the first large photodiode 105a nor the second large photodiode 105b is saturated. FIG. 13 illustrates a case where capturing is performed in a brighter place (defined as an intermediate bright place herein) than the case in FIG. 12, specifically, a case where the first large photodiode 105a is saturated but the second large photodiode 105b is not saturated.

FIG. 14 illustrates a case where capturing is performed in a place (defined as a very bright place herein) brighter than the intermediate bright place, specifically, a case where both the first large photodiode 105a and the second large photodiode 105b are saturated. The very bright place also includes a place where direct sunlight reaches. FIGS. 12 to 14 illustrate cases where neither the first small photodiode 106a nor the second small photodiode 106b is saturated in any case.

The case where capturing is performed in a dark place will be described with reference to FIG. 12. At the period from the time point A to the time point B, the LED display device is not turned on, and thus both the voltage values of the optical signals of the first large photodiode 105a and the second large photodiode 105b increase according to the light quantity of the surrounding environment.

At the period from the time point B to the time point C, the LED display device is turned on, and thus the voltage value of the optical signal of the first large photodiode 105a is further increased by the adding of the light quantity of the LED. On the other hand, the voltage value of the optical signal of the second large photodiode 105b increases according to the light quantity of the surrounding environment.

The LED display device is not turned on at the period from the time point C to the time point E. Thus, at the period from the time point C to the time point D, both the voltage values of the optical signals of the first large photodiode 105a and the second large photodiode 105b increase according to the light quantity of the surrounding environment. At the period from the time point D to the time point E, that is, the second exposure time T2, both the voltage values of the optical signals of the first large photodiode 105a and the second large photodiode 105b increase according to the light quantity of the surrounding environment.

At the first exposure time T1, both the voltage values of the optical signals of the first large photodiode 105a and the second large photodiode 105b are equal to or greater than a predetermined value. Therefore, the output signal is a voltage value obtained by adding the voltage value of the optical signal obtained at the second exposure time T2 to the voltage value of the optical signal obtained at the first exposure time T1.

An inclination at which the voltage values of the optical signals of the small photodiodes 106a and 106b increase is smaller even with the same quantity of light as compared to an inclination at which the voltage values of the optical signals of the large photodiodes 105a and 105b. For this reason, both the voltage values of the optical signals of the first small photodiode 106a and the second small photodiode 106b are less than the predetermined value at the first exposure time T1. Therefore, since the optical signal obtained at the second exposure time T2 is not added, the optical signal obtained at the first exposure time T1 becomes the output signal.

Since the output signal from the first large photodiode 105a and the output signal from the second large photodiode 105b have different voltage values, it is possible to suppress the influence of the flicker of the captured image. In addition, since the voltage values of the output signals of the first small photodiode 106a and the second small photodiode 106b are different, it is possible to suppress the influence of the flicker of the captured image. Accordingly, the solid-state imaging device 1 can be applied to be mounted on the vehicle.

In capturing in a dark place, the large photodiodes 105a and 105b have a wider dynamic range than the small photodiodes 106a and 106b, and when the voltage value of the optical signal at the first exposure time T1 is equal to or greater than the predetermined value, the optical signal obtained at the second exposure time T2 is added so that the dynamic range further expands. Accordingly, the large photodiodes 105a and 105b are effective in capturing in a dark place.

The case of capturing in an intermediate bright place will be described with reference to FIG. 13. At the period from the time point A to the time point B, since the LED display device is not turned on, both the voltage values of the optical signals of the first large photodiode 105a and the second large photodiode 105b increase according to the light quantity of the surrounding environment.

In the case of capturing in an intermediate bright place, since the surrounding environment is brighter than in the case of capturing in a dark place, the inclination at which the voltage values of the optical signals of the large photodiodes 105a and 105b and the small photodiodes 106a and 106b increase becomes larger than in the case of capturing in a dark place.

At the period from the time point B to the time point C, since the LED display device is turned on, the voltage value of the optical signal of the first large photodiode 105a is further increased and saturated by the adding of light quantity of the LED. On the other hand, the voltage value of the optical signal of the second large photodiode 105b increases according to the light quantity of the surrounding environment.

The LED display device is not turned on at the period from the time point C to the time point E. Thus, at the period from the time point C to the time point D, the voltage value of the optical signal of the second large photodiode 105b increases according to the light quantity of the surrounding environment. On the other hand, the first large photodiode 105a maintains a constant voltage value after saturation. At the period from the time point D to the time point E, that is, the second exposure time T2, both the voltage values of the optical signals of the first large photodiode 105a and the second large photodiode 105b increase according to the light quantity of the surrounding environment.

Both the voltage values of the optical signals of the first large photodiode 105a and the second large photodiode 105b are equal to or greater than the predetermined value at the first exposure time T1. Accordingly, the output signal is a voltage value obtained by adding the voltage value of the optical signal obtained at the second exposure time T2 to the voltage value of the optical signal obtained at the first exposure time T1.

In contrast, both the voltage values of the optical signals of the first small photodiode 106a and the second small photodiode 106b are less than the predetermined value at the first exposure time T1. Accordingly, since the optical signal obtained at the second exposure time T2 is not added, the optical signal obtained at the first exposure time T1 becomes the output signal.

Since the output signal from the first large photodiode 105a and the output signal from the second large photodiode 105b have different voltage values, it is possible to suppress the influence of the flicker of the captured image. In addition, since the voltage values of the output signals of the first small photodiode 106a and the second small photodiode 106b are different, it is possible to suppress the influence of the flicker of the captured image. Accordingly, the solid-state imaging device 1 can be applied to be mounted on the vehicle.

In the case of capturing in an intermediate bright place, the large photodiodes 105a and 105b have a wider dynamic range than the small photodiodes 106a and 106b, and when the voltage value of the optical signal at the first exposure time T1 is equal to or greater than the predetermined value, the optical signal obtained at the second exposure time T2 is added so that the dynamic range further expands. Accordingly, the large photodiodes 105a and 105b are effective in capturing in an intermediate bright place.

The case of capturing in a very bright place will be described with reference to FIG. 14. At the period from the time point A to the time point B, since the LED display device is not turned on, both the voltage values of the optical signals of the first large photodiode 105a and the second large photodiode 105b increase according to the light quantity of the surrounding environment.

In the case of capturing in a very bright place, since the surrounding environment is brighter than in the case of capturing in an intermediate bright place, the inclination at which the voltage values of the optical signals of the large photodiodes 105a and 105b and the small photodiodes 106a and 106b increase becomes larger than in the case of capturing in an intermediate bright place.

At the period from the time point B to the time point C, since the LED display device is turned on, the voltage value of the optical signal of the first large photodiode 105a is further increased and saturated by adding of the light quantity of the LED. The voltage value of the optical signal of the second large photodiode 105b is increased and saturated according to the light quantity of the surrounding environment. Accordingly, in the case of capturing in a very bright place, both the optical signal of the first large photodiode 105a and the optical signal of the second large photodiode 105b are saturated with the first exposure time T1 and have the same voltage value.

The LED display device is not turned on at the period from the time point C to the time point E, but the first large photodiode 105a and the second large photodiode 105b are already saturated. Thus, the same voltage value is maintained at the period from the time point C to the time point D. At the period from the time point D to the time point E, that is, the second exposure time T2, both the voltage values of the optical signals of the first large photodiode 105a and the second large photodiode 105b increase according to the light quantity of the surrounding environment.

Both the voltage values of the optical signals of the first large photodiode 105a and the second large photodiode 105b are equal to or greater than the predetermined value at the first exposure time T1. Accordingly, the output signal is a voltage value obtained by adding the voltage value of the optical signal obtained at the second exposure time T2 to the voltage value of the optical signal obtained at the first exposure time T1.

In the case of capturing in a very bright place, the first large photodiode 105a and the second large photodiode 105b have the same voltage value of the optical signal at the first exposure time T1 and the second exposure time T2, and thus there is no level difference of the output signal. Accordingly, in the case of capturing in a very bright place, since the level difference of the output signal does not occur in the large photodiodes 105a and 105b, the captured image is influenced by the flicker.

Meanwhile, at the period from the time point A to the time point B, since the LED display device is not turned on, both of the voltage values of the optical signals of the first small photodiode 106a and the second small photodiode 106b increase according to the light quantity of the surrounding environment.

At the period from the time point B to the time point C, since the LED display device is turned on, the voltage value of the optical signal of the first small photodiode 106a is further increased by the adding of light quantity of the LED. The voltage value of the optical signal of the second small photodiode 106b increases, according to the light quantity of the surrounding environment.

The LED display device is not turned on at the period from the time point C to the time point E. Thus, at the period from the time point C to the time point D, both of the voltage values of the optical signals of the first small photodiode 106a and the second small photodiode 106b increases according to the light quantity of the surrounding environment. At the period from the time point D to the time point E, that is, the second exposure time T2, both the voltage values of the optical signals of the first small photodiode 106a and the second small photodiode 106b increase according to the light quantity of the surrounding environment.

The voltage value of the optical signal of the first small photodiode 106a is equal to or greater than the predetermined value at the first exposure time T1. Accordingly, the output signal is a voltage value obtained by adding the voltage value of the optical signal obtained at the second exposure time T2 to the voltage value of the optical signal obtained at the first exposure time T1. On the other hand, the voltage value of the optical signal of the second small photodiode 106b is less than the predetermined value at the first exposure time T1. Accordingly, since the optical signal obtained at the second exposure time T2 is not added to the second small photodiode 106b, the optical signal obtained at the first exposure time T1 becomes the output signal.

Since the output signal from the first small photodiode 106a and the output signal from the second small photodiode 106b have different voltage values, it is possible to suppress the influence of the flicker of the captured image. In the case of capturing in a very bright place, specifically, when the LED display device is not turned on at the second exposure time T2, the small photodiodes 106a and 106b are effective. Accordingly, the solid-state imaging device 1 can be applied to be mounted on the vehicle by imaging with the small photodiodes 106a and 106b.

Herein, a description is made with respect to the capacitance of the capacitors 2561 and 2562 holding the optical signal obtained at the first exposure time T1 and the capacitance of the capacitors 2571 and 2572 holding the optical signal obtained at the second exposure time T2.

The capacitors 2561 and 2562 are in charge of imaging in cases where the exposure time is long and the light quantity is low. For this reason, the noise level thereof is desirably reduced. Meanwhile, the capacitors 2571 and 2572 are in charge of imaging for enlarging the optical signal in a case where the light quantity is high. Therefore, the capacitors 2571 and 2572 may have a higher noise level than the capacitors 2561 and 2562.

Therefore, the capacitors 2561 and 2562 have desirably a larger capacitance than the capacitors 2571 and 2572. Since the noise level increases as the capacitance of the capacitors 2571 and 2572 decreases, it is desirable to set a predetermined value according to the noise level (specifically, to raise the predetermined value as the noise level increases). Preferably, the predetermined value is experimentally obtained.

Since the capacitors 2551 and 2552 hold an optical signal of a low level (reference potential), it is desirable to increase the capacitance and to reduce the noise level. Accordingly, it is desirable that the capacitors 2551 and 2552 and the capacitors 2561 and 2562 have a higher capacitance than the capacitors 2571 and 2572.

The solid-state imaging device 1 has the photodiodes of difference sizes to perform the imaging with the photodiode of an effective size according to the light quantity of the surrounding environment of the place to be captured, thereby capable of suppressing the influence of the flicker of the captured image, and thus the solid-state imaging device 1 can be applied to be mounted on the vehicle.

The invention is not limited to the configuration of the above-described embodiment, and various modifications can be made without departing from the scope of the invention.

For example, the ADC circuit is configured using the comparator and the counter and the CDS process is performed in the embodiment described above, but the CDS process may be performed by a clamp circuit using a capacitor, or the CDS process may be performed using a differential amplifier. Further, a pipeline-type AD converter or the like may be used.

What is claimed is:

1. A solid-state image pickup device comprising:
a plurality of optoelectronic conversion units having different sizes;
a first optical signal accumulation unit configured to perform an optoelectronic conversion in a first period by the optoelectronic conversion units and accumulate a first optical signal;
a first reference potential accumulation unit configured to accumulate a first reference potential corresponding to the first optical signal;
a second optical signal accumulation unit configured to perform an optoelectronic conversion in a second period by the optoelectronic conversion units and accumulate a second optical signal, the second period being shorter than the first period; and
a combining unit configured to perform a Correlated Double Sampling (CDS) process, the combining unit comprising:
a counter configured to:
count in a downward direction to acquire a first value corresponding to the first reference potential,
after acquiring the first value, count in an upward direction to acquire a second value corresponding to the first optical signal in the first period,
based on the second value being equal to or greater than a predetermine value, count in the downward direction to acquire a third value corresponding to the first reference potential, and
after acquiring the third value, count in the upward direction to acquire a fourth value corresponding to the second optical signal in the second period, and store the fourth value as the CDS processed optical signal.

2. The solid-state image pickup device according to claim 1, wherein a capacitance of the second optical signal accumulation unit is smaller than that of the first optical signal accumulation unit.

3. The solid-state image pickup device according to claim 1, wherein, the combining unit combines the second optical signal with the first optical signal when a noise in the first optical signal is equal to or larger than a noise in the second optical signal.

4. The solid-state image pickup device according to claim 3, wherein the combining unit determines that the noise in the first optical signal is equal to or larger than the noise in the second optical signal when a value of the first optical signal is equal to or greater than a predetermined threshold, and combines the second optical signal with the first optical signal.

5. The solid-state image pickup device according to claim 1, wherein the first optical signal accumulation unit accumulates the first optical signal obtained by performing the optoelectronic conversion in the first period by all of the plurality of optoelectronic conversion units, and the second optical signal accumulation unit accumulates the second optical signal obtained by performing the optoelectronic conversion in the second period by all of the plurality of optoelectronic conversion units.

6. The solid-state image pickup device according to claim 1, wherein the counter is an up-down counter that is configured to count in both the downward direction in which a number decreases and in the upward direction in which a number increases.

7. The solid-state image pickup device according to claim 6, wherein the up-down counter stops counting in the downward direction based on a result of a comparison between the first optical signal and a ramp waveform signal.

8. The solid-state image pickup device according to claim 6, wherein when a voltage value of the first optical signal is not equal to or greater than a threshold value, the second optical signal is not added to the up-down counter.

* * * * *